(12) United States Patent
Morooka et al.

(10) Patent No.: US 7,422,922 B2
(45) Date of Patent: Sep. 9, 2008

(54) PHOTOELECTRIC CONVERSION ELEMENT AND PROCESS FOR FABRICATING THE SAME, ELECTRONIC DEVICE AND PROCESS FOR FABRICATING THE SAME

(75) Inventors: Masahiro Morooka, Kanagawa (JP); Yusuke Suzuki, Kanagawa (JP); Kazuhiro Noda, Kanagawa (JP)

(73) Assignee: Sony Corporation, Tokyo (JP)

( * ) Notice: Subject to any disclaimer, the term of this patent is extended or adjusted under 35 U.S.C. 154(b) by 535 days.

(21) Appl. No.: 10/541,877

(22) PCT Filed: Dec. 25, 2003

(86) PCT No.: PCT/JP03/16731

§ 371 (c)(1), (2), (4) Date: Jul. 8, 2005

(87) PCT Pub. No.: WO2004/064192

PCT Pub. Date: Jul. 29, 2004

(65) Prior Publication Data

US 2006/0107994 A1    May 25, 2006

(30) Foreign Application Priority Data

Jan. 8, 2003    (JP)    ............................. 2003-001969

(51) Int. Cl.
*H01L 21/00*    (2006.01)

(52) U.S. Cl. ................. 438/63; 257/431; 257/E31.001; 136/250

(58) Field of Classification Search ............. 438/63, 438/89; 257/431; 136/250

See application file for complete search history.

(56) References Cited

U.S. PATENT DOCUMENTS

| 5,320,723 A | 6/1994 | Kawakami |
| 5,350,644 A | 9/1994 | Graetzel et al. |

(Continued)

FOREIGN PATENT DOCUMENTS

EP    1 058 260 A1    12/2000

(Continued)

OTHER PUBLICATIONS

U.S. Appl. No. 10/542,193, filed Jul. 14, 2005, inventor Masahiro Morooka.

(Continued)

*Primary Examiner*—Zandra Smith
*Assistant Examiner*—Christy L Novacek
(74) *Attorney, Agent, or Firm*—Wolf, Greenfield & Sacks, P.C.

(57) ABSTRACT

In a photoelectric conversion device using a semiconductor electrode composed of semiconductor nanoparticles, the semiconductor electrode is made by coating and drying a paste containing a binder and semiconductor nanoparticles dispersed therein on a transparent conductive substrate, and pressing the paste to bond the semiconductor nanoparticles onto the transparent conductive substrate while heating it to a temperature in the range from 30° C. to the softening temperature of the transparent conductive substrate, or, if the semiconductor nanoparticles retain a sensitizing dye, to a temperature in the range from 30° C. to lower one of the softening temperature of the transparent conductive substrate and the deactivation temperature of the sensitizing dye.

18 Claims, 2 Drawing Sheets

U.S. PATENT DOCUMENTS

| | | | |
|---|---|---|---|
| 5,940,550 | A | 8/1999 | Plickert et al. |
| 6,261,684 | B1 | 7/2001 | Takahashi et al. |
| 6,376,765 | B1 | 4/2002 | Wariishi et al. |
| 6,586,670 | B2 | 7/2003 | Yoshikawa |
| 6,602,998 | B2 | 8/2003 | Kobuke et al. |
| 6,766,817 | B2 | 7/2004 | da Silva |
| 6,911,595 | B2 | 6/2005 | Yoshikawa et al. |
| 6,929,970 | B2 * | 8/2005 | Andriessen et al. ............ 438/57 |
| 2001/0027252 | A1 | 10/2001 | Kobuke et al. |
| 2002/0015881 | A1 | 2/2002 | Nakamura |
| 2002/0031080 | A1 | 3/2002 | Inoue |
| 2003/0183271 | A1 | 10/2003 | Ikeda et al. |
| 2003/0188776 | A1 | 10/2003 | Li et al. |
| 2004/0202064 | A1 | 10/2004 | Inoue et al. |
| 2004/0250267 | A1 | 12/2004 | Tsutsumi et al. |
| 2004/0251508 | A1 | 12/2004 | Tomita |
| 2005/0016578 | A1 | 1/2005 | Enomoto |
| 2005/0022221 | A1 | 1/2005 | Inatani et al. |
| 2005/0218467 | A1 | 10/2005 | Tomita |
| 2005/0224112 | A1 | 10/2005 | Tokita et al. |
| 2006/0048812 | A1 | 3/2006 | Tomita |
| 2006/0084257 | A1 | 4/2006 | Tokita |
| 2006/0107994 | A1 | 5/2006 | Marooka et al. |
| 2006/0112988 | A1 | 6/2006 | Marooka |
| 2006/0137739 | A1 | 6/2006 | Imoto et al. |

FOREIGN PATENT DOCUMENTS

| | | |
|---|---|---|
| EP | 1 100 086 A2 | 5/2001 |
| EP | 1 152 418 A1 | 11/2001 |
| EP | 1 156 488 A2 | 11/2001 |
| EP | 1 431 971 A1 | 6/2004 |
| JP | 10-209048 A | 8/1998 |
| JP | 10-255863 A | 9/1998 |
| JP | 10-255863 A1 | 9/1998 |
| JP | 11-354169 A | 12/1999 |
| JP | 2000-106222 A | 4/2000 |
| JP | 2000-195569 A | 7/2000 |
| JP | 2000-231942 A | 8/2000 |
| JP | 2000-285975 A | 10/2000 |
| JP | 2001-093591 A | 4/2001 |
| JP | 2001-93591 A | 4/2001 |
| JP | 2001-111074 A | 4/2001 |
| JP | 2001-143771 A | 5/2001 |
| JP | 2001-253883 A | 9/2001 |
| JP | 2002-008740 A | 1/2002 |
| JP | 2002-8740 A | 1/2002 |
| JP | 2002-8741 A | 1/2002 |
| JP | 2002-008741 A | 1/2002 |
| JP | 2002-25635 A | 1/2002 |
| JP | 2002-025635 A | 1/2002 |
| JP | WO 02/14322 | 2/2002 |
| JP | 2002-175843 A | 6/2002 |
| JP | 2002-222971 A | 8/2002 |
| JP | 2002-289269 A | 10/2002 |
| JP | 2002-289269 A1 | 10/2002 |
| JP | 2002-289274 A | 10/2002 |
| JP | 2002-319689 A | 10/2002 |
| JP | 2002-352868 A | 12/2002 |
| JP | 2002-352869 A | 12/2002 |
| JP | 2002-352870 A | 12/2002 |
| JP | 2002-353432 A | 12/2002 |

OTHER PUBLICATIONS

U.S. Appl. No. 10/543,050, filed Jul. 21, 2005, inventor Kenichi Ishibashi et al.

Uchida, Satoshi, "Application of Titania Nanotubes to A Dye-Sensitized Solar Cell," Electrochemistry, Jun. 2002, vol. 70, No. 6, pp. 418-420.

Adachi, Motonari, "Dye-Sensitized Solar Cells Using Semiconductor Thin Film Composed of Titania Nanotubes," Electrochemistry, Jun. 2002, vol. 70, No. 6, pp. 449-452.

Adachi, Motonari, "Formation, Characterization, and Functions of Ceramic Nanotubes," Transactions of the Materials Research Society of Japan, Sep. 2002, vol. 27, No. 3, pp. 505-508.

Ngamsinlapasathian, S., "Titania Nanotube o Mochiiru Shikiso Zokan Taiyodenchi no Kokoritsuka," The Society of Chemical Engineers, Japan Dai 35 Kai Shuki Taikai Kenkyu Happyo Koen Yoshishu, Aug. 2002, p. 843.

Ngamsinlapasathian, S., "Higher Efficiency in Dye-Sensitized Solar Cells Using Titania Nanotube,"2002 Nen Denki Kagaku Shuki Taikai Koen Yoshishu, Sep. 2002, p. 138.

Adachi, M., "Formation of Titanium Oxide Nanotubes and Application to Dye-Sensitized Solar Cells," The Electrochemical Society of Japan Dai 68 Kai Taikai Koen Yoshishu, Mar. 2001, p. 112.

Murata, Y., The Synthetic Conditions of Titania Nanotubes Using Template of Molecular Assemblies, CSJ: The Chemical Society of Japan Dai 82 Shuki Nenkai Koen Yokoshu, Sep. 2002, p. 178.

E-mail from Silva, E ; "US 20060107994—Requesting IDS of 6,766,817"; May 25, 2006.

E-mail from Silva, E ; "US 20050016578—Requesting IDS of 6,766,817"; May 25, 2006.

Tachibana, Y. et al., "Electron Injection and Recombination in Dye Sensitized Nanocrystalline Titanium Dioxide Films: A Comparison of Ruthenium Bipyridyl and Porphyrin Sensitizer Dyes," J. Phys. Chem. B, 2000, pp. 1198-1205, vol. 104.

Optoelectronic. (2001). In Hargrave's Communications Dictionary, Wiley. Retrieved Dec. 18, 2007 from http://www.credoreference.com/entry/2723224.

Meinhardt et al. "Optoelectronic Device made from Multilayer and Molecularly Doped Organic Layers," SPIE Conference on Organic Photonic Materials and Devices vol. 3623, Jan. 1999, pp. 46-57.

http://server2.idtechex.com/products/en/presentation.asp-?presentationid=646 : Accessed on Jan. 31, 2008.

Imahori, Hiroshi, "Recent Advances in Research and Development for Dye-Sensitized Solar Cells: Photoelectric Conversion by Electrode Bonded with Monomolecular Film of Porphyrin," May 25, 2000, Chapter 32, Kurashiki Printing Co., Ltd., Osaka, Japan.

Ma, Tingli, et al. "Recent Advances in Research and Development for Dye-Sensitized Solar Cells: Development of Porphyrin-Sensitized Solar Cells," May 25, 2000, Chapter 15, Kurashiki Printing Co., Ltd., Osaka, Japan.

* cited by examiner

PHOTOELECTRIC CONVERSION ELEMENT AND PROCESS FOR FABRICATING THE SAME, ELECTRONIC DEVICE AND PROCESS FOR FABRICATING THE SAME

TECHNICAL FIELD

This invention relates to a photoelectric conversion device, a manufacturing method thereof, an electronic apparatus and a manufacturing method thereof, which are suitable for application to wet solar cells using semiconductor electrodes made of semiconductor nanoparticles.

BACKGROUND ART

It is generally recognized that the use of fossil fuel such as coal and petroleum as energy sources invites global warming by resultant carbon dioxide. The use of atomic energy is accompanied by the risk of contamination by radioactive rays. Currently under various discussions on the environmental issues, dependence upon these kinds of energy is undesirable.

On the other hand, solar cells, which are photoelectric conversion devices for converting sunlight to electric energy, use sunlight as their energy resources, and they produce only a small adverse effect to the global environment. Therefore, wider promulgation of solar cells is anticipated.

Although there are various materials of solar cells, a number of solar cells using silicon are commercially available. These solar cells are roughly classified to crystalline silicon solar cells using single crystal or polycrystal and amorphous silicon solar cells. In conventional solar cells, single crystal silicon or polycrystal silicon, i.e. crystalline silicon, has been used often.

In crystalline silicon solar cells, photoelectric conversion efficiency, which represents the performance of converting light (sun) energy to electrical energy, is higher than that of amorphous silicon solar cells. However, since crystalline silicon solar cells need much energy and time for crystal growth, they are disadvantageous from the viewpoint of their costs.

Amorphous silicon solar cells are advantageous in higher light absorption, wider selectable range of substrates and easier enlargement of the scale. However, photoelectric conversion efficiency of amorphous silicon solar cells is lower than that of crystalline silicon solar cells. Furthermore, although amorphous silicon solar cells are higher in productivity than crystalline silicon solar cells, they need an evacuation process for the manufacture. Therefore, the burden related to facilities for fabrication of crystalline silicon solar cells is still heavy.

On the other hand, there have been long researches in solar cells using organic materials toward more cost reduction of solar cells. However, they exhibit as low photoelectric conversion coefficient as 1%, and involve difficulties in durability.

Under the circumstances, an inexpensive solar cell using dye-sensitized porous semiconductor particles was introduced in Nature 353, p. 737, 1991 (Literature 1). This is a wet solar cell, i.e. an electrochemical photocell whose photo electrode is a titanium oxide porous film spectrally sensitized by using ruthenium complex as a sensitizing dye. Advantages of this solar cell are: permitting the use of inexpensive oxide semiconductors such as titanium oxide; wide light absorption of the sensitizing dye over the visible wavelength up to 800 nm; and high quantum efficiency of the photoelectric conversion enough to realize a high energy conversion efficiency. Moreover, because the solar cell does not need a process in a vacuum for its manufacture, it does not require bulky facilities or equipment.

This solar cell, however, requires the use of a substrate resistible to the baking temperature as high as approximately 500° C. in the high-temperature burning process for making its porous semiconductor electrode, and here is the problem of reducing the selectable range of substrates. In this connection, a number of researches have been reported regarding methods of making semiconductor electrodes by baking at temperatures lower than 300° C. as well as such methods by dry film deposition or wet electrolytic deposition without relying on the baking process. However, semiconductor electrodes made by these methods are not sufficient in durability, and photoelectric conversion efficiency of solar cells currently remains lower than several %.

Under the circumstances, A. Hagfeldt et al. disclosed a process capable of making a semiconductor electrode at room temperatures by coating a paste of titanium oxide nanoparticles containing a binder on a substrate and pressing the paste to bond the semiconductor nanoparticles onto the substrate (Journal of Photochemistry and Photobiology A: Chemistry, 145, p. 107, 2001 (Literature 2)).

According to Literature 2, photoelectric conversion efficiency of a dye-sensitized solar cell having the semiconductor electrode made at room temperature reaches 4 to 5%. However, the photoelectric conversion efficiency is still lower than that of a solar cell having a semiconductor electrode made by the baking process. In addition, although this method of making the semiconductor electrode at room temperatures makes it possible to use even a plastic substrate having low heat resistance as a support member of a transparent electrode, the semiconductor nanoparticle layer formed on the plastic substrate by pressure bonding is low in adhesiveness to the substrate and flexibility, and therefore unreliable in durability against bending or expansion and contraction. In addition, since ethyl cellulose used in Literature 2 as a binding agent is soluble to alcohol and organic solvents, it dissolves into the dye solution and electrolytic solution used for the dying with the dye, and invites serious characteristic deterioration with time.

It is therefore an object of the invention is to provide a photoelectric conversion device that is enhanced in adhesiveness to the substrate of the semiconductor electrode made of semiconductor nanoparticles and in flexibility of the semiconductor electrode, also enhanced in durability against bending or expansion and extraction, and excellent in photoelectric conversion property, as well as a manufacturing method of the device.

More generally, the object of the invention is to provide an electronic apparatus that is enhanced in adhesiveness of a substrate of a semiconductor electrode made of semiconductor nanoparticles and in flexibility of the semiconductor electrode, also enhanced in durability against bending or expansion and contraction, and excellent in property, as well as a manufacturing method of the device.

DISCLOSURE OF INVENTION

As a result of various experiments and examinations to solve the problems involved in the conventional techniques, the Inventor has recognized that it is more effective for enhancement of the adhesiveness of the semiconductor electrode to the substrate, enhancement of the flexibility and enhancement of photoelectric conversion efficiency to conduct the process of pressing the paste with dispersed semiconductor nanoparticles at higher temperatures rather than room temperatures, and has reached to the present invention.

To accomplish the above problem, according to the first aspect of the present invention, there is provided a manufacturing method of a photoelectric conversion device using a semiconductor electrode composed of semiconductor nanoparticles, comprising:

coating a paste containing a binder and semiconductor nanoparticles dispersed therein on a transparent conductive substrate; and forming the semiconductor electrode by drying the paste, and thereafter pressing the paste to bond the semiconductor nanoparticles onto the transparent conductive substrate while heating it to a temperature in the range from 30° C. to the softening temperature of the transparent conductive substrate.

According to the second aspect of the present invention, there is provided a photoelectric conversion device using a semiconductor electrode composed of semiconductor nanoparticles, comprising:

the said semiconductor electrode formed by:

coating a paste containing a binder and semiconductor nanoparticles dispersed therein on a transparent conductive substrate; and forming the semiconductor electrode by drying the paste, and thereafter pressing the paste to bond the semiconductor nanoparticles onto the transparent conductive substrate while heating it to a temperature in the range from 30° C. to the softening temperature of the transparent conductive substrate.

According to the third aspect of the invention, there is provided a manufacturing method of a photoelectric conversion device using a semiconductor electrode composed of semiconductor nanoparticles, comprising:

coating a paste containing a binder and containing semiconductor nanoparticles retaining a sensitizing dye and dispersed therein on a transparent conductive substrate; and forming the semiconductor electrode by drying the paste, and thereafter pressing the paste to bond the semiconductor nanoparticles onto the transparent conductive substrate while heating it to a temperature in the range from 30° C. to lower one of the softening temperature of the transparent conductive substrate and the deactivation temperature of the sensitizing dye.

According to the fourth aspect of the invention, there is provided a photoelectric conversion device using a semiconductor electrode composed of semiconductor nanoparticles, comprising:

the said semiconductor electrode formed by:

coating a paste containing a binder and containing semiconductor nanoparticles retaining a sensitizing dye and dispersed therein on a transparent conductive substrate; and forming the semiconductor electrode by drying the paste, and thereafter pressing the paste to bond the semiconductor nanoparticles onto the transparent conductive substrate while heating it to a temperature in the range from 30° C. to lower one of the softening temperature of the transparent conductive substrate and the deactivation temperature of the sensitizing dye.

In the present invention, the temperature upon pressing the dry paste is preferably equal to or higher than 40° C., or more preferably equal to or higher than 50° C., to ensure efficient enhancement of adhesiveness and flexibility of the semiconductor electrode to the substrate. On the other hand, in the case where semiconductor nanoparticles dispersed in the paste already retain the sensitizing dye, the upper limit of the temperature upon the press is generally from 150 to 200° C., although depending on the transparent conductive substrate and the sensitizing dye used. The temperature upon the press is typically in the range from 50° C. to 120° C. The paste is dried to remove the solvent contained in the paste. The temperature for the drying is not higher than the boiling point of the solvent. If the solvent is water, the temperature is around 50° C., for example. If the solvent is an organic solvent, the temperature is generally around 100° C.

Any method is used to press the paste, such as press molding by a flat plate press, roll press by rolls, for example, or rolling (calendar), among others. Pressure applied to the paste upon the press is not limited in upper limit. High pressure can enhance adhesiveness of the semiconductor nanoparticle layer to the substrate, and can realize a photoelectric conversion device excellent in durability. The pressure is normally 500 kg/cm$^2$ or more. Preferably, it is 1000 kg/cm$^2$ or more. Mote preferably, it is 5000 kg/cm$^2$. Length of time for the hot press is not limited exclusively. Normally, however, it is from one second to 600 seconds approximately. When the productivity and the adhesiveness of the semiconductor nanoparticle layer are taken into consideration, the length of time is preferably from 3 seconds to 300 seconds.

The transparent conductive substrate may be made by forming a transparent conductive film on a conductive or non-conductive transparent support substrate, or may be an electrically conductive transparent substrate in its entirety. The transparent support substrate preferably has high blocking capability against intruding moisture and gas from outside the photoelectric conversion device, high resistance to the solvent and high weatherability. Examples of such substrates are transparent inorganic substrates of quartz, glass, or the like, transparent plastic substrates of polyethylene terephthalate, polyethylene naphthalate, polycarbonate, polystyrene, polyethylene, polypropylene, polyphenylene sulfide, polyvinylidene fluoride, tetraacetyl cellulose, phenoxy bromide, kinds of aramid, kinds of polyimide, kinds of polystyrene, kinds of polyarylate, kinds of polysulfone, kinds of polyolefin, and so forth. However, materials of the substrate are not limited to these examples. Taking easier workability, lighter weight, etc. into account, a transparent plastic substrate is preferably used as the transparent support substrate. There is no particular limitation to the thickness of the conductive substrate. The thickness may be determined freely depending upon the light transmittance, blocking capability between the inside and the outside of the photoelectric conversion device, and other factors.

It is desirable that the transparent conductive substrate has surface resistance as low as possible. More specifically, surface resistance of the transparent conductive substrate is preferably 500 Ω/□ or less, and more preferably 100 Ω/□ or less. In case the conductive substrate is made by forming a transparent conductive film on a transparent support substrate, known materials can be used. Examples of such materials are indium-tin complex oxide (ITO), fluorine-doped $SnO_2$ (FTO) and $SnO_2$. Usable materials are not limited to those examples, and two or more of them can be used in combination as well. For the purpose of reducing the surface resistance of the transparent conductive substrate and thereby enhancing the collecting efficiency, patterned metal wiring of high conductivity can be made on the transparent conductive substrate.

Usable materials of semiconductor nanoparticles are elementary semiconductors represented by silicon, various compound semiconductors, compounds having a perovskite structure, and so forth. These semiconductors are preferably n-type semiconductors in which electrons in the conduction band behave as carriers and provide an anode current when excited by light. Examples of such semiconductors are metal oxides such as $TiO_2$, $ZnO$, $WO_3$, $Nb_2O_3$, $TiSrO_2$ and $SnO_2$. Among them, $TiO_2$ is especially desirable. However, usable semiconductors are not limited to the above examples, and two or more of them may be used in mixture.

There are no special restrictions regarding the grain size of the semiconductor nanoparticles. However, the grain size is preferably 1-200 nm and more preferably 5-100 nm in average grain size of primary particles. It is also possible to mix semiconductor nanoparticles larger in average grain size with the semiconductor nanoparticles having the aforementioned average grain size to have the semiconductor nanoparticles larger in average grain size to scatter incident light, thereby enhancing the quantum yield. In this case, the average grain size of the semiconductor nanoparticles to be added is preferably 20-500 nm.

The paste containing the binding agent and semiconductor nanoparticles dispersed therein may be made by any method. However, when physical properties, convenience, manufacturing costs, etc. are taken into consideration, wet film-forming methods are preferable. Especially recommended is a method of preparing a paste prepared by uniformly dispersing semiconductor nanoparticles in powder or sol into water or other solvent and further adding a binder, and coating it on the transparent conductive substrate. Any coating method may be used here for example among dipping, spraying, wire bar technique, spin coating, roller coating, blade coating, gravure coating and other known techniques. Alternatively, any wet printing method can be used for example among relief printing, offset printing, gravure printing, intaglio printing, rubber plate printing, screen printing, and so forth. In the case where crystalline titanium oxide is used as the material of the semiconductor nanoparticles, it preferably has an anatase crystal structure from the photocatalytic standpoint. Anatase-type titanium may be commercially available powder, sol or slurry, or may be uniformed in grain size by a known technique such as hydrolyzing titanium oxide alcoxide. In the case where commercially available powder is used, secondary agglomeration of particles is preferably prevented. For this purpose, the powder preferably undergoes grinding of particles in a mortar or a ball mill upon preparation of the coating liquid. In this process, to prevent that particles once released from secondary agglomeration agglomerate again, acetylacetone, hydrochloric acid, nitric acid, surfactant, chelating agent, or the like, may be added.

The binder added to the paste is preferably insoluble to the dye solution and the electrolytic solution used for dying with the dye. Known binders are usable here, such as kinds of cellulose, kinds of polyether, polyvinyl alcohol, polyacrylic acid, polyachrylamide, polyethylene glycol, polyethylene imine, poly(metha)acrylic methyl, polyvinylidene fluoride, styrene butadiene rubber, polyamide imide, polytetra fluoroethylene (fluorocarbon resin), and so forth. However, the binder is not limited to these materials, but two or more kinds of them may be used in combination.

In general, as the semiconductor nanoparticle layer increases its thickness, its light-capturing rate increases because of an increase of retained dye particles per unit projected area. However, because injected electrons must travel longer to diffuse, the loss by charge recombination also increases. Therefore, there is a preferable range of thickness for the semiconductor nanoparticle layer. It is generally 0.1-100 μm, more preferably 1-50 μm, and most preferably 3-30 μm. To increase the thickness of the semiconductor nanoparticle layer, after it is formed by press molding, the paste may be coated again on the former semiconductor nanoparticle layer and pressed again to accumulate semiconductor nanoparticle layers. For the purpose of increasing the surface area of the semiconductor nanoparticles, removing impurities from the semiconductor nanoparticle layer and enhancing the electron injection efficiency from the dye to the semiconductor nanoparticles, the semiconductor nanoparticle layer may undergo chemical plating using water solution of titanium tetrachloride or electrochemical plating using water solution of titanium trichloride. In addition, a conduction-assisting agent may be added to reduce the impedance of the semiconductor nanoparticle layer.

Any dye, having a sensitizing function, may be employed to be retained by the semiconductor nanoparticles. Examples of the dye are xanthene-based dyes such as rhodamine B, rose bengal, eosin and Erythrocin; cyanine-based dyes such as quinocyanine and cryptocyanine; basic dyes such as phenosafranine, Capri blue, thiocin and methylene blue; porphyrin-based compounds such as chlorophyll, zinc porphyrin and magnesium porphyrin; azo dyes; phthalocyanine compounds; coumarin-based compounds; ruthenium (Ru) bipyridine complex compound; anthraquinone-based dyes; and polycyclic quinone-based dyes. Among them, Ru bipyridine complex compound is preferable because of its high quantum yield. However, without being limited to it, those dyes can be used alone or in combination of two or more kinds of them.

The dye may be retained by the semiconductor nanoparticle layer in any form or manner. For example, a typical method dissolves any of the above-mentioned dyes in a solution such as alcohols, nitriles, nitromethane, halogenated hydrocarbon, ethers, dimethyl sulfoxide, amides, N-methylpyrrolidone, 1, 3-dimethyl imidazolidinone, 3-methyl oxazolidinone, esters, carbonic acid esters, ketones, hydrocarbon, water, and so on; and next immerses the semiconductor nanoparticle layer therein, or coats the dye solution on the semiconductor nanoparticle layer. It is more desirable to use the method dissolve the dye into the paste with semiconductor nanoparticles dispersed therein, then coat the dye-retained semiconductor nanoparticles, and bond it by press molding. In this case, the introduced quantity of dye molecules relative to one semiconductor nanoparticle is preferably in the range of 1-1000 molecules, and more preferably in the range of 1-100 molecules. If greatly excessive dye molecules are retained by semiconductor nanoparticles, electrons excited by light energy are not injected into semiconductor nanoparticles and instead deoxidize the electrolyte. Thus, excessive dye molecules rather invite energy loss. Therefore, it is ideal that a single dye molecule is retained by a single semiconductor nanoparticle, and the temperature and pressure for retainment can be changed if necessary. For the purpose of reducing association of dye particles, carboxylic acid such as deoxycholic acid may be added as well. It is also possible to use an ultraviolet absorbent together.

For the purpose of removing excessively retained dye particles, the semiconductor nanoparticle layer retaining the dye may undergo surface treatment using a kind of amine. Examples of amine substances are pyridine, 4-tert-butyl pyridine, polyvinyl pyridine, and so on. If they are liquids, they can be used either directly or in form of solution in an organic solvent.

Any conductive material may be used as the counter electrode. Even an insulating material can be used in combination with a conductive layer faced to the semiconductor electrode. However, the material used as the electrode is preferably stable in electrochemical properties. In this sense, platinum, gold, carbon, or the like, is preferably used. To enhance the oxidation-reduction catalytic effect, one side of the counter electrode opposed to the semiconductor electrode preferably has a minute structure increased in surface area. For example, in case of platinum, it is preferably in the state of platinum black. In case of carbon, it is preferably in a porous state. Such a platinum black state can be made by anodic oxidation, chloroplatinic treatment, or the like. Porous carbon can be made by sintering of carbon nanoparticles, calcination of organic polymer, or the like.

The electrolyte may be a combination of iodine ($I_2$) and a metal iodide or organic iodide, or a combination of boron ($Br_2$) and a metal boride or organic boride. Also usable are metal complex compounds such as ferrocyanic acid salt/ferricyanic acid salt and ferrocene/ferricynium ions, sulfur compounds such as sodium polysulfide and alkylthiol/alkyldisulfide, viologen dyes, hydroquinone/quinone, and so forth. Preferable cations of the above metal compounds are Li, Na, K, Mg, Ca, Cs, or the like, and preferable cations of the above organic compounds are quaternary ammonium compounds such as kinds of tetraalkyl ammonium, kinds of pyridinium, kinds of imidazolium, and so forth. However, without being limited to them, cations may be combinations of two or more kinds of them. Among them, electrolytes combining $I_2$ and quaternary ammonium compounds such as LiI, NaI or imidozolium iodides, or the like, are desirable. Concentration of the electrolyte salt is preferably 0.05-5 M, or more preferably 0.2-1 M, with respect to the solvent. Concentration of $I_2$ and $Br_2$ is preferably 0.0005-1 M, or more preferably 0.001-0.1 M. To improve the open-circuit voltage and short-circuit current, various kinds of additives such as 4-tert-butyl pyridine, carboxylic acid, or the like, may be added.

The solvent composing the electrolyte composite may be selected from water, alcohols, ethers, esters, carbonic acid esters, lactones, carboxylic acid esters, phosphoric triesters, heterocyclic compounds, nitrites, ketones, amides, nitromethane, halogenated hydrocarbon, dimethyl sulfoxide, sulforan, N-methylpyrrolidone, 1,3-dimethyl imidazolidinone, 3-methyl oxazolidinone, hydrocarbon, and so forth, each alone, or in combination of two or more kinds of them. As the solvent, room-temperature ionic liquids of quaternary ammonium salts of tetra alkyls, pyridiniums or imidazoliums are usable as well.

To reduce leakage of liquids in or from the photoelectric device and vaporization of the electrolyte, it is also possible to dissolve a gelatinizer, polymer, crosslinking monomer, or the like, into the electrolyte composite to make a gel electrolyte. As to the ratio of the electrolyte composite relative to the gel matrix, as the electrolyte composite increases, the ion conductivity gets higher, but the mechanical strength decreases. In contrast, if the electrolyte composite decreases, the mechanical strength increases, but the ion conductivity decreases. Therefore, the electrolyte composite is preferably 50-99 wt %, and more preferably 80-97 wt % of the gel electrolyte. It is also possible to realize a fully solid photoelectric conversion device by dissolving the electrolyte and a plasticizer into a polymer and removing the plasticizer by vaporization.

The photoelectric conversion device may be manufactured by any method. For example, in the case where the electrolyte is in a liquid form, or has a liquid form before being introduced but can be gelatinized inside the photoelectric conversion device, the semiconductor electrode and the counter electrode are put together face to face, and part of the substrate excluding the portion having the semiconductor electrode is sealed to prevent these two electrodes from contacting with each other. The gap between the semiconductor electrode and the counter electrode may be determined appropriately. However, it is normally 1-100 μm, or more preferably 1-50 μm. If the distance between the electrodes is too long, light current decreases due to a decrease of the conductivity. Any method can be used for the sealing. However, it is preferable to use a material excellent in resistance to light, electrical insulation and damp-proof capability. For this purpose, various methods and materials are usable, such as epoxy resins, ultraviolet-setting resins, acrylic adhesives, EVA (ethylene vinyl acetate), ionomer resins, ceramics, heat seal films, and so forth. An injection hole required for introducing the solution of the electrolyte composite may be made at any position except the position of the semiconductor electrode layer and the counter electrode at the portion opposed thereto. The solution may be introduced by any method. However, the solution is preferably introduced inside the cell already sealed and having the solution injection hole. In this case, it is an easy way to pour drops of the solution into the injection hole and introduce it inside by capillary phenomenon. If desired, introduction of the solution may be conducted under reduced pressure or heat. After the solution is fully introduced, an extra amount of the solution remaining in the injection hole is removed, and the injection hole is sealed. Any method may be used for the sealing of the injection hole. If necessary, however, a glass plate or a plastic substrate, for example, may be bonded with a sealing agent to seal the injection hole. In the case of gel electrolytes and fully solid electrolytes using polymers or the like, the polymer solution containing an electrolyte composite and a plasticizer is removed by vaporization by a casting method from above the dye-retained semiconductor electrode. After the plasticizer is fully removed, the injection hole is sealed in the above manner. This sealing is preferably made in a vacuum sealer, or the like, under an inactive gas atmosphere or a reduced pressure. After the sealing, heat or pressure may be applied, if necessary, to impregnate the semiconductor nanoparticle layer with the electrolyte.

The photoelectric conversion device may be fabricated in various forms suitable for their use, without being limited to specific forms.

The above methods of forming semiconductor electrodes composed of semiconductor nanoparticles by coating paste with semiconductor nanoparticles dispersed therein on a transparent conductive substrate and pressure-bonding the semiconductor nanoparticles onto the transparent conductive substrate by pressing the paste while heating it to a temperature not higher than the softening temperature of the transparent conductive substrate can be used to make not only photoelectric conversion devices but also all electronic apparatuses using semiconductor electrodes composed of semiconductor nanoparticles.

Therefore, according to the fifth aspect of the invention, there is provided a manufacturing method of an electronic apparatus using a semiconductor electrode composed of semiconductor nanoparticles, comprising:

coating a paste containing a binder and semiconductor nanoparticles dispersed therein on a substrate; and forming the semiconductor electrode by drying the paste, and thereafter pressing the paste to bond the semiconductor nanoparticles onto the substrate while heating it to a temperature in the range from 30° C. to the softening temperature of the substrate.

According to the sixth aspect of the invention, there is provided an electronic apparatus using a semiconductor electrode composed of semiconductor nanoparticles, comprising:

the said semiconductor electrode formed by:

coating a paste containing a binder and semiconductor nanoparticles dispersed therein on a substrate; and forming the semiconductor electrode by drying the paste, and thereafter pressing the paste to bond the semiconductor nanoparticles onto the substrate while heating it to a temperature in the range from 30° C. to the softening temperature of the substrate.

According to the seventh aspect of the invention, there is provided a manufacturing method of an electronic apparatus using a semiconductor electrode composed of semiconductor nanoparticles, comprising:

coating a paste containing a binder and containing semiconductor nanoparticles retaining a sensitizing dye and dispersed therein on a substrate; and forming the semiconductor electrode by drying the paste, and thereafter pressing the paste to bond the semiconductor nanoparticles onto the substrate while heating it to a temperature in the range from 30° C. to lower one of the softening temperature of the substrate and the deactivation temperature of the sensitizing dye.

According to the eighth aspect of the invention, there is provided an electronic apparatus using a semiconductor electrode composed of semiconductor nanoparticles, comprising:

the said semiconductor electrode formed by:

coating a paste containing a binder and containing semiconductor nanoparticles retaining a sensitizing dye and dispersed therein on a substrate; and forming the semiconductor electrode by drying the paste, and thereafter pressing the paste to bond the semiconductor nanoparticles onto the substrate while heating it to a temperature in the range from 30° C. to lower one of the softening temperature of the transparent conductive substrate and the deactivation temperature of the sensitizing dye.

The statement made in conjunction with the first to fourth aspects of the invention is applicable to the fifth to eighth aspects of the invention as well within the extent not contradicting their natures. However, in some applications of the electronic apparatuses, the substrate for making the semiconductor electrode thereon need not be conductive or transparent.

According to the invention having the above construction, it forms the semiconductor electrode by pressing the paste containing the binder and semiconductor nanoparticles dispersed therein while heating it to a temperature in the range from 30° C. to the softening temperature of the transparent conductive substrate or the substrate, or to a temperature in the range from 30° C. to the lower one of the softening temperature of the transparent conductive substrate or the substrate and the deactivation temperature of the sensitizing dye, and thereby bonding the semiconductor nanoparticles onto the substrate. Therefore, the invention can enhance the adhesiveness and flexibility of the semiconductor electrode to the substrate, and can enhance the durability of the semiconductor electrode against curving and bending.

BEST MODE FOR CARRYING OUT THE INVENTION

An embodiment of the invention will now be explained below with reference to the drawings.

Figure 1:
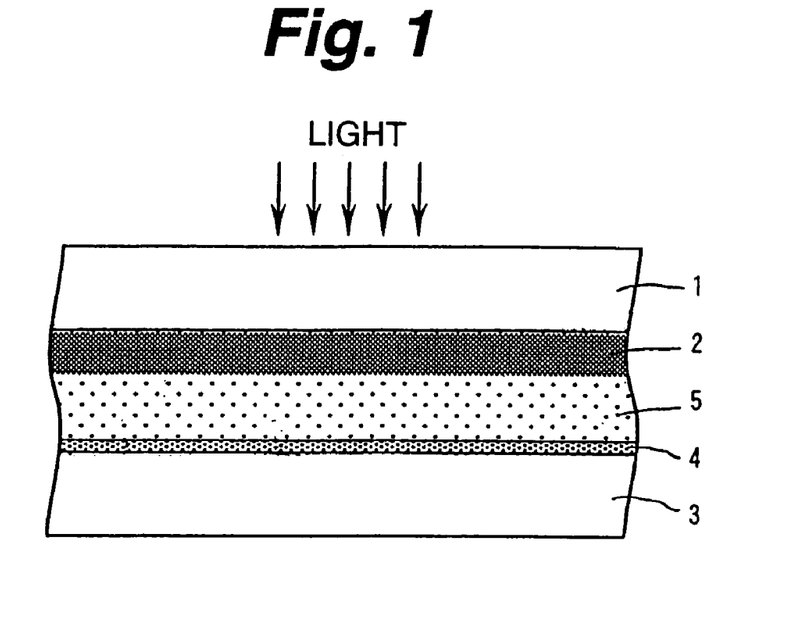
FIG. 1 is a cross-sectional view of the substantial part of a dye sensitized wet-type photoelectric conversion device according to an embodiment of the invention.

FIG. 1 shows a dye sensitized wet-type photoelectric conversion device according to an embodiment of the invention.

As shown in FIG. 1, in the dye sensitized wet-type photoelectric conversion device, a transparent conductive substrate 1, having a semiconductor nanoparticle layer 2 (semiconductor electrode) retaining a sensitizing dye thereon, and a transparent conductive substrate 3, having a platinum or platinum catalyst layer 4 thereon, are put together such that the semiconductor nanoparticle layer 2 and the platinum or platinum catalyst layer 4 face to each other via a predetermined distance. In a space between them, an electrolyte layer (electrolytic solution) 5 is enclosed. The electrolyte layer 5 is sealed by a predetermined seal member, not shown. The semiconductor nanoparticle layer 2 is formed by pressing a paste already retaining a sensitizing dye and containing semiconductor nanoparticles dispersed therein with a press.

Figure 2:
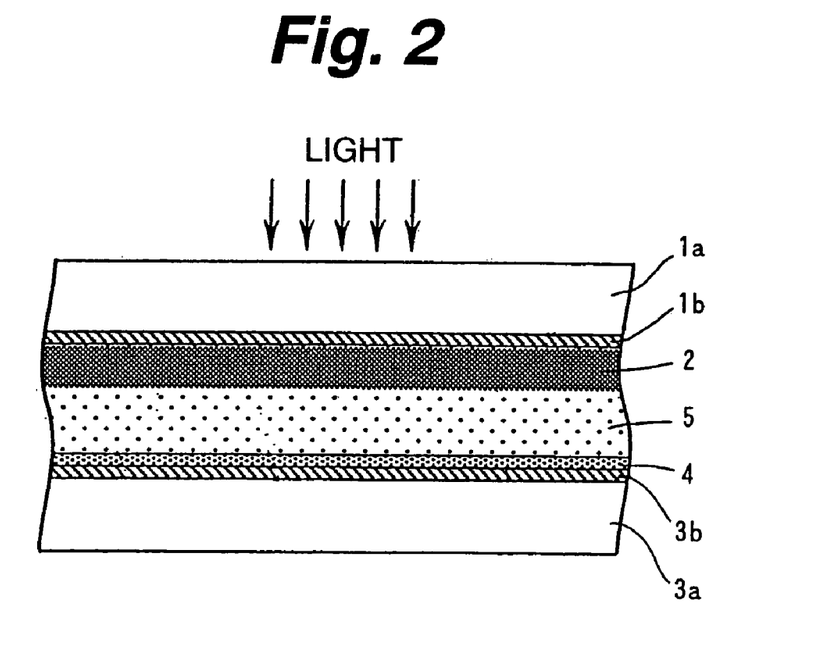
FIG. 2 is a cross-sectional view of the substantial part of a dye sensitized wet-type photoelectric conversion device according to an embodiment of the invention.

FIG. 2 shows a dye sensitized wet-type photoelectric conversion device in which the transparent conductive substrate 1 has the structure having a transparent electrode 1b on a transparent substrate 1a, and the transparent conductive substrate 3 has the structure having a transparent electrode 3b on a transparent substrate 3a.

Materials of the transparent conductive substrate 1 (or transparent substrate 1a plus transparent electrode 1b), semiconductor nanoparticle layer 2, transparent conductive substrate 3 (or transparent substrate 3a plus transparent electrode 3b) and electrolyte layer 5 may be selected appropriately from the materials already introduced herein.

Next explained is a manufacturing method of the dye sensitized wet-type photoelectric conversion device.

Figure 3A:
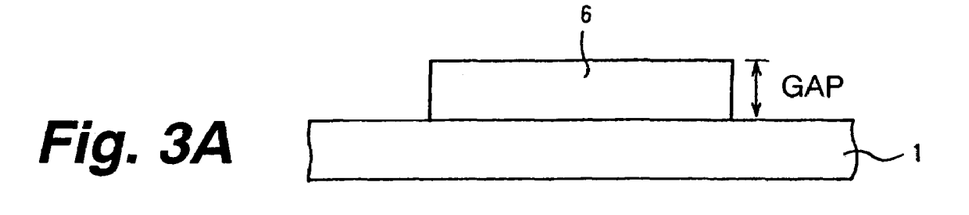
FIG. 3A and FIG. 3B are cross-sectional views for explaining a manufacturing method of a dye sensitized wet-type photoelectric conversion device according to an embodiment of the invention.
Figure 3B:
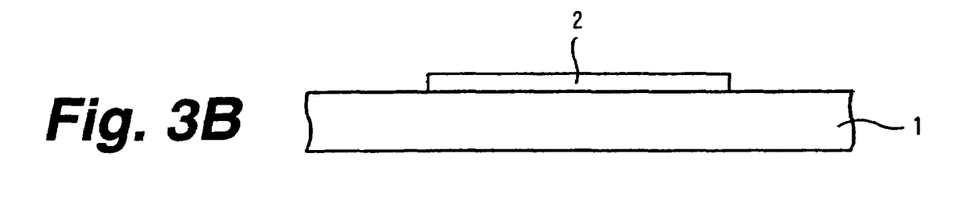

First prepared is the transparent conductive substrate 1. Next as shown in FIG. 3A, paste 6 containing a binder and containing dye-retained semiconductor nanoparticles dispersed therein is coated on the transparent conductive substrate 1 with a predetermined gap (thickness). The paste 6 is next pressed by a predetermined method with predetermined pressure while heated to a temperature in the range from 30° C. to lower one of the softening temperature of the transparent conductive substrate 1 and the deactivation temperature of the sensitizing dye, or more preferably in the range from 50° C. to 120° C. The pressure for the press is 500 kg/cm$^2$ or more, or more preferably in the range from 5000 kg/cm$^2$ to 20000 kg/cm$^2$. As a result of the hot press, the dye-retained semiconductor nanoparticle layer 2 is bonded onto the transparent conductive substrate 1 as shown in FIG. 3B.

On the other hand, the transparent conductive substrate 3 is prepared separately, and a platinum or platinum catalyst layer 4 is formed thereon.

In the next step, the transparent conductive substrate 1 and the transparent conductive substrate 3 are put together such that the semiconductor nanoparticle layer 2 and the platinum or platinum catalyst layer 4 face to each other via a distance of 1-100 μm or more preferably of 1-50 μm while making a space for receiving the electrolyte layer 5 by using a predetermined sealing member. Then, the electrolyte layer 5 is introduced into the space through an injection hole previously made, and the injection hole is closed thereafter. As a result, the dye sensitized wet-type photoelectric conversion device is completed.

Next explained are operations of the dye sensitized wet-type photoelectric conversion device.

Incident light entering from and passing through the transparent substrate 1 excites the sensitizing dye retained on the surface of the semiconductor nanoparticle layer 2, and generates electrons. The electrons are quickly delivered from the sensitizing dye to the semiconductor nanoparticles of the semiconductor nanoparticle layer 2. On the other hand, the sensitizing dye having lost the electrons again receives electrons from ions of the electrolyte layer 5, and molecules having delivered the electrons again receive electrons at the platinum or platinum catalyst layer 4 of the counter electrode. Through these serial actions, electromotive force is generated between the transparent conductive substrate 1 electrically connected to the semiconductor nanoparticle layer 2, and the transparent conductive substrate 3 electrically connected to the platinum or platinum catalyst layer 4. Photoelectric conversion takes place in this manner.

As explained above, according to this embodiment, the semiconductor nanoparticle layer 2 is made on the transparent conductive substrate by pressing the paste 6 containing the binder and containing dye-retained semiconductor nanoparticles onto the substrate 1 while heating it to a temperature in the range from 30° C. to lower one of the softening temperature of the transparent conductive substrate 1 and the deactivation temperature of the sensitizing dye, or more preferably to a temperature in the range from 50° C. to 120° C. Therefore, the embodiment can enhance the adhesiveness and flexibility of the semiconductor nanoparticle layer 2 to the substrate, and can enhance the durability against bending as well as expansion and contraction, while ensuring sufficiently high photoelectric conversion efficiency. Thus, the embodiment can realize the dye sensitized wet-type photoelectric conversion device, in particular, a dye sensitized wet-type solar cell, which is excellent in both durability and photoelectric conversion efficiency. Furthermore, since the embodiment can manufacture the dye sensitized wet-type photoelectric conversion device without using a baking process requiring a high temperature, materials of the substrates can be selected from more candidates.

Some practical examples of the dye sensitized wet-type photoelectric conversion device are explained below. Conditions of the examples are shown in Table 1. In addition, results of measurement of the practical examples are shown in Table 2 together with results of measurement of the comparative examples.

TABLE 1

| | Press Temperature (° C.) | Press Pressure (kg/cm$^2$) | Binder |
|---|---|---|---|
| Example 1 | 120 | 10000 | Hydroxyethyl cellulose |
| Example 2 | 120 | 5000 | " |
| Example 3 | 120 | 1000 | " |
| Example 4 | 70 | 10000 | " |
| Example 5 | 70 | 5000 | " |
| Example 6 | 70 | 1000 | " |
| Example 7 | 120 | 10000 | " |
| Example 8 | 120 | 5000 | " |
| Example 9 | 120 | 1000 | " |
| Example 10 | 70 | 10000 | " |
| Example 11 | 70 | 5000 | " |
| Example 12 | 70 | 1000 | " |
| Example 13 | 120 | 10000 | Ethyl cellulose |
| Example 14 | 120 | 10000 | Carboxymethyl cellulose |
| Example 15 | 120 | 10000 | Polyvinyl alcohol |
| Example 16 | 120 | 10000 | Polyacrylic acid |
| Example 17 | 120 | 10000 | Polyacryl amide |
| Example 18 | 120 | 10000 | Polyethylene imine |
| Example 19 | 120 | 10000 | Polyethylene glycol |
| Example 20 | 120 | 10000 | Polyvinylidene fluoride |
| Example 21 | 120 | 10000 | Polymethacrylic acid methyl |
| Example 22 | 120 | 10000 | Styrene butadiene rubber |
| Example 23 | 120 | 10000 | Hydroxyethyl cellulose |
| Comparative 1 | Room Temperature | 10000 | " |
| Comparative 2 | Room Temperature | 5000 | " |
| Comparative 3 | Room Temperature | 1000 | " |
| Comparative 4 | Room Temperature | 10000 | " |
| Comparative 5 | Room Temperature | 5000 | " |
| Comparative 6 | Room Temperature | 1000 | " |

TABLE 2

| | Just after made | One month later | Two months later | Three months later |
|---|---|---|---|---|
| Example 1 | 7.5% (○) | 7.3% (○) | 7.2% (○) | 7.2% (○) |
| Example 2 | 6.2% (○) | 6.0% (○) | 5.7% (○) | 5.5% (○) |
| Example 3 | 5.8% (○) | 5.4% (○) | 5.2% (Δ) | 5.0% (Δ) |
| Example 4 | 5.9% (○) | 5.5% (○) | 5.2% (○) | 5.0% (○) |
| Example 5 | 5.5% (○) | 5.2% (○) | 4.8% (○) | 4.6% (○) |
| Example 6 | 5.1% (○) | 4.5% (○) | 4.0% (Δ) | 3.7% (Δ) |
| Example 7 | 7.2% (○) | 7.0% (○) | 6.9% (○) | 6.8% (○) |
| Example 8 | 6.0% (○) | 5.7% (○) | 5.5% (○) | 5.3% (○) |
| Example 9 | 5.6% (○) | 5.2% (○) | 5.0% (○) | 4.7% (Δ) |
| Example 10 | 5.4% (○) | 5.1% (○) | 4.9% (○) | 4.8% (○) |
| Example 11 | 5.2% (○) | 4.9% (○) | 4.7% (○) | 4.5% (○) |
| Example 12 | 4.9% (○) | 4.7% (○) | 4.4% (Δ) | 4.1% (Δ) |
| Example 13 | 7.3% (○) | 7.1% (○) | 7.0% (○) | 6.9% (○) |
| Example 14 | 7.4% (○) | 7.3% (○) | 7.2% (○) | 7.2% (○) |
| Example 15 | 7.2% (○) | 7.2% (○) | 7.1% (○) | 7.1% (○) |
| Example 16 | 7.1% (○) | 7.0% (○) | 7.0% (○) | 6.9% (○) |
| Example 17 | 6.8% (○) | 6.7% (○) | 6.6% (○) | 6.6% (○) |
| Example 18 | 6.6% (○) | 6.5% (○) | 6.4% (○) | 6.3% (○) |
| Example 19 | 7.0% (○) | 6.8% (○) | 6.6% (○) | 6.4% (○) |
| Example 20 | 7.2% (○) | 7.2% (○) | 7.1% (○) | 7.1% (○) |
| Example 21 | 6.9% (○) | 6.8% (○) | 6.8% (○) | 6.7% (○) |
| Example 22 | 6.7% (○) | 6.6% (○) | 6.5% (○) | 6.3% (○) |
| Example 23 | 7.5% (−) | 7.3% (−) | 7.3% (−) | 7.2% (−) |
| Comparative 1 | 4.5% (Δ) | 4.1% (Δ) | 3.8% (X) | 3.4% (X) |
| Comparative 2 | 4.2% (Δ) | 3.6% (X) | 3.4% (X) | 3.0% (X) |
| Comparative 3 | 3.9% (X) | 3.7% (X) | 3.5% (X) | 3.0% (X) |
| Comparative 4 | 4.5% (Δ) | 4.0% (Δ) | 3.7% (X) | 3.5% (X) |
| Comparative 5 | 4.1% (X) | 3.7% (X) | 3.5% (X) | 3.3% (X) |
| Comparative 6 | 3.9% (X) | 3.6% (X) | 3.4% (X) | 3.2% (X) |
| Comparative 7 | 7.5% (−) | 7.4% (−) | 7.4% (−) | 7.4% (−) |
| Comparative 8 | 2.6% (−) | 2.0% (−) | 1.5% (−) | 1.1% (−) |
| Comparative 9 | 1.2% (X) | 0.6% (X) | 0.3% (X) | 0.2% (X) |

Marks in parentheses indicate the following states.
○: Good.
Δ: Cracks were found.
X: Exfoliation were found.

EXAMPLE 1

TiO$_2$ nanoparticles were used as semiconductor nanoparticles. Referring to known methods (H. Arakawa, "Latest Techniques of Dye-sensitized Solar Cells" (C.M.C.) p. 45-47 (2001)), paste with dispersed nanoparticles was prepared as follows. 125 ml of titanium isopropoxide was seeped slowly into 750 ml of 0.1M nitric acid water solution while stirring it at the room temperature. After the seeping, the solution was moved to a constant temperature bath held° at 80° C. and stirred therein for 8 hours. Thereby, a cloudy, semi-transparent sol solution was obtained. The sol solution was left to cool down to the room temperature, then filtered through a glass filter, and 700 ml thereof was measured up. The sol solution obtained was moved to an autoclave, then treated by water and heat at 220° C. for 12 hours, and thereafter dispersed by ultrasonic treatment for one hour. Subsequently, the solution was condensed by an evaporator at 40° C. until the content of $TiO_2$ becomes 20 wt %. The condensed sol solution was added with hydroxyethyl cellulose by 5 wt % relative to the weight of $TiO_2$ in the paste, and mixed homogenously in a planet ball mill to obtain a viscosity-improved $TiO_2$ paste.

After that, cis-bis(isothiocyanate)-N,N-bis(2,2'-dipyridile)-4,4'-dicarboxylic acid)-ruthenium (II) dehydrate was dissolved to the $TiO_2$ paste by the ratio of 10 molecules per one nanoparticle of $TiO_2$ in introduced quantity to have it absorbed by the $TiO_2$ paste.

The dye-retained $TiO_2$ paste obtained was coated on a conductive PET substrate having sheet resistance of 50 Ω/☐) having one surface coated by $SnO_2$ to have the size of 1 cm×1 cm and the gap of 200 μm by blade coating, and pressure of 10000 kg/cm$^2$ was applied for 30 seconds at 120° C. by a press machine. On the dye-retained $TiO_2$ paste nanoparticle layer thus obtained, the same dye-retained $TiO_2$ paste was coated by another gap of 200 μm by blade coating to make a pressure-bonded dye-retained $TiO_2$ nanoparticle layer under the same conditions.

The counter electrode used was prepared by sputtering 100 nm thick platinum on a conductive PET substrate (having sheet resistance of 50 Ω/☐) already having a 1 mm sized injection hole and surface-coated by $SnO_2$.

The prepared dye-retained $TiO_2$ nanoparticle layer, i.e. the semiconductor electrode, was placed face to face with the platinum surface of the counter electrode, and their outer circumference was sealed with a 30 μm thick EVA film and epoxy adhesive.

On the other hand, an electrolyte composite was prepared by dissolving 0.04 g of lithium iodide (LiI), 0.479 g of 1-propyl-2,3-dimethyl imidazolium iodide, 0.0381 g of iodine ($I_2$) and 0.2 g of 4-tert-butyl pyridine into 3 g of methoxypropionitrile and thereby preparing a mixed solution.

The above mixed solution was introduced into the device by seeping drops thereof into the injection hole of the device prepared and reducing the pressure, and the injection hole was sealed by an EVA film, epoxy adhesive and PET substrate. Thus, the photoelectric conversion device was completed.

EXAMPLES 2 TO 6

Dye sensitized wet-type photoelectric conversion devices were prepare in the same manner as Example 1 except the pressing of the paste under the conditions shown in Table 1.

EXAMPLE 7

$TiO_2$ paste prepared in the same manner as that of Example 1 was directly coated on a conductive PET substrate (having sheet resistance of 50 Ω/☐) having $SnO_2$ coating on its surface to be sized 1 cm×$x_1$ cm and make the gap of 200 μm by blade coating, and pressure of 10000 kg/cm$^2$ was applied to the paste for 30 seconds at 120° C. by a press machine. On the dye-retained $TiO_2$ paste nanoparticle layer thus obtained, the same dye-retained $TiO_2$ paste was coated by another gap of 200 μm by blade coating to make a pressure-bonded dye-retained $TiO_2$ nanoparticle layer under the same conditions.

After that, the substrate was immersed in a dehydrated ethanol solution in which 0.5 mM of cis-bis(isothiocyanate)-N,N-bis(2,2'-dipyridile)-4,4'-dicarboxylic acid)-ruthenium (II) dihydrate and 20 mM of deoxycholic acid for 12 hours to have the dye retained by the $TiO_2$ nanoparticle layer. The dye-retained $TiO_2$ nanoparticle layer obtained was washed first by ethanol solution of 4-tert-butyl pyridine and next by dehydrated ethanol, and dried in a dark place.

Assembling of the photoelectric conversion device and preparation of the electrolyte composite were the same as those of Example 1.

EXAMPLES 8 TO 12

Dye sensitized wet-type photoelectric conversion devices were prepared in the same manner as Example 1 except the pressing of the paste under the conditions shown in Table 1.

EXAMPLES 13 TO 19

Dye sensitized wet-type photoelectric conversion devices were prepared in the same manner as Example 1 except the use of the binders shown in Table 1.

EXAMPLE 20

$TiO_2$ condensed sol solution prepared in the same manner as Example 1 was dried in an evaporator and a reduced-pressure drier. After that, 20 wt % of $TiO_2$, 1 wt % of polyvinylidene fluoride and 79 wt % of N-methyl pyrrolidone were mixed in a planet ball mill to obtain a viscosity-improved $TiO_2$ paste.

Way of retaining the dye, press molding, assembling of the photoelectric conversion device and preparation of the electrolyte composite were the same as those of Example 1.

EXAMPLES 21 AND 22

Dye sensitized wet-type photoelectric conversion devices were prepared in the same manner as Example 1 except the use of the binders shown in Table 1.

EXAMPLE 23

A fluorine-doped conductive glass substrate (having sheet resistance of 10 Ω/☐ was used as the transparent conductive substrate. The counter electrode was prepared by sputtering 100 nm thick platinum on a fluorine doped conductive glass substrate (having sheet resistance of 10 Ω/☐) already having a 1 mm sized injection hole, then seeping drops of ethanol solution of chloroplatinic acid on the platinum, and heating it to 385° C. for chloroplatinic treatment. Except them, in the same manner as Example 1, the dye sensitized wet-type photoelectric conversion device was prepared.

COMPARATIVE EXAMPLES 1 TO 6

Dye sensitized wet-type photoelectric conversion devices were prepared in the same manner as Example 1 except the pressing of the paste under the conditions shown in Table 1.

COMPARATIVE EXAMPLE 7

The $TiO_2$ condensed sol solution prepared in Example 1 was added with polyethylene glycol (PEG) having the 500 thousand molecular mass, and mixed homogenously in a planet ball mill to obtain a viscosity-improved $TiO_2$ paste.

The $TiO_2$ paste obtained was coated on a fluorine-doped conductive glass substrate having sheet resistance 10 Ω/☐) to have the size of 1 cm×1 cm and the gap of 200 μm by blade coating, and held at 450° C. for 30 minutes to sinter $TiO_2$ on the conductive glass substrate.

After that, the substrate was immersed in a dehydrated ethanol solution in which 0.5 mM of cis-bis(isothiocyanate)-N,N-bis(2,2'-dipyridile)-4,4'-dicarboxylic acid)-ruthenium (II) dihydrate and 20 mM of deoxycholic acid for 12 hours to have the dye retained by the $TiO_2$ nanoparticles. The dye-retained $TiO_2$ nanoparticle layer obtained was washed first by ethanol solution of 4-tert-butyl pyridine and next by dehydrated ethanol, and dried in a dark place.

The counter electrode was prepared by sputtering 100 nm thick platinum on a fluorine doped conductive glass substrate (having sheet resistance of 10 Ω/☐) already having a 1 mm sized injection hole, then seeping drops of ethanol solution of chloroplatinic acid on the platinum, and heating it to 385° C. for chloroplatinic treatment.

The prepared dye-retained $TiO_2$ nanoparticle layer was placed face to face with the platinum surface of the counter electrode, and their outer circumference was sealed with a 30 μm thick EVA film and epoxy adhesive.

On the other hand, an electrolyte composite was prepared by dissolving 0.04 g of lithium iodide (LiI), 0.479 g of 1-propyl-2,3-dimethyl imidazolium iodide, 0.0381 g of iodine ($I_2$) and 0.2 g of 4-tert-butyl pyridine into 3 g of methoxypropionitrile and thereby preparing a mixed solution.

The above mixed solution was introduced into the device by seeping drops thereof into the injection hole of the device prepared and reducing the pressure, and the injection hole was sealed by an EVA film, epoxy adhesive and PET substrate. Thus, the photoelectric conversion device was completed.

COMPARATIVE EXAMPLE 8

The dye sensitized wet-type photoelectric conversion device was prepared in the same manner as Comparative Example 1 except the sintering temperature of $TiO_2$ being 150° C.

COMPARATIVE EXAMPLE 9

A conductive PET substrate (having sheet resistance of 50 Ω/☐) covered by $SnO_2$ was used as the transparent conductive substrate. The counter electrode was prepared by sputtering 100 nm thick platinum on a conductive PET substrate (having sheet resistance of 50 Ω/☐) already having a 1 mm sized liquid injection hole and having $SnO_2$ coating on its surface. Except them, in the same manner as Comparative Example 8, the dye sensitized wet-type photoelectric conversion device was prepared.

With the dye sensitized wet-type photoelectric conversion devices prepared as Examples 1 to 23 and Comparative Examples 1 to 9, photoelectric conversion efficiency upon exposure to artificial sunlight (AM 1.5, 100 mW/cm$^2$) was measured every month up to three months later. Devices using plastic substrates as their supports of transparent conductive substrates were held in a posture facing the light-receiving sides of the photoelectric conversion devices and bent by the curvature of ⅕ mm at room temperature in a dark place. Devices using glass substrates as their supports were held as they are at room temperature in a dark place.

As to the bent photoelectric conversion devices, conditions of $TiO_2$ nanoparticles were visually observed. Results of the measurement are shown in Table 2.

It is appreciated from Table 2 that the dye sensitized wet-type photoelectric conversion devices prepared as Examples 1 to 23 exhibit photoelectric conversion efficiency equivalent to that of the dye sensitized wet-type photoelectric conversion devices prepared as Comparative Examples 7 to 9 by the conventional baking process and have much more excellent in property than those prepared by the low-temperature baking process. It is also appreciated that the devices according to the invention are excellent in durability without cracks and exfoliation even when using plastic substrates and bent. It is further appreciated that the dye sensitized wet-type photoelectric conversion devices according to Examples 1 to 23 are more excellent in photoelectric conversion efficiency and durability than the dye sensitized wet-type photoelectric conversion devices according too Comparative Examples 1 to 6 pressed at room temperature.

Heretofore, an embodiment and practical examples of the invention have been explained. However, the invention are not limited to the embodiment and practical examples, bur contemplates various changes and modifications based upon the technical concept of the invention.

For example, numerical values, structures, shapes, materials, source materials, processes, and so on, are not but mere examples, and any other appropriate numerical values, structures, shapes, materials, source materials, processes, and so on, may be employed, if necessary.

More specifically, although the above-explained embodiment has been explained as coating the paste already retaining the sensitizing dye in semiconductor nanoparticles, the sensitizing dye not retaining the sensitizing dye in semiconductor nanoparticles may be first coated, and the sensitizing dye may be added later to the coated paste to have the dye retained by semiconductor nanoparticles in the paste.

As described above, according to the invention, the semiconductor electrode is made by first coating and drying the paste containing the binder and containing dye-retained semiconductor nanoparticles on the transparent conductive substrate, and then pressing the paste to bond the semiconductor nanoparticles onto the transparent conductive substrate while heating it to a temperature in the range from 30° C. to the softening temperature of the transparent conductive substrate, or lower one of the softening temperature of the transparent conductive substrate and the deactivation temperature of the sensitizing dye. Therefore, the invention can provide a photoelectric conversion device enhanced in adhesiveness and flexibility of the semiconductor electrode to the substrate, enhanced in durability against bending as well as expansion and contraction, while ensuring sufficiently high photoelectric conversion efficiency.

In addition, according to the invention, the semiconductor electrode is made by first coating and drying the paste containing the binder and containing dye-retained semiconductor nanoparticles on the substrate, and then pressing the paste to bond the semiconductor nanoparticles onto the substrate while heating it to a temperature in the range from 30° C. to the softening temperature of the transparent conductive substrate, or lower one of the softening temperature of the transparent conductive substrate and the deactivation temperature of the sensitizing dye. Therefore, the invention can provide an electronic apparatus enhanced in adhesiveness and flexibility of the semiconductor electrode to the substrate, enhanced in durability against bending as well as expansion and contraction, while ensuring sufficiently high photoelectric conversion efficiency.

The invention claimed is:

1. A method of manufacturing a photoelectric conversion device using a semiconductor electrode comprising semiconductor nanoparticles, the method comprising:
    coating a paste containing a binder and semiconductor nanoparticles dispersed therein on a transparent conductive substrate; and
    forming the semiconductor electrode by drying the paste, and thereafter pressing the paste to bond the semiconductor nanoparticles onto the transparent conductive substrate while heating it to a temperature in the range from 30° C. to a softening temperature of the transparent conductive substrate, wherein pressing the paste includes contacting the paste with a device suited for pressing.

2. The method of manufacturing a photoelectric conversion device according to claim 1 wherein the temperature is equal to or higher than 50° C.

3. The method of manufacturing a photoelectric conversion device according to claim 1 wherein the temperature is equal to or lower than 200° C.

4. The method of manufacturing a photoelectric conversion according to claim 1 wherein the temperature is in a range from 50° C. to 120° C.

5. The method of manufacturing a photoelectric conversion device according to claim 1 wherein the transparent conductive substrate includes a transparent plastic substrate.

6. The method of manufacturing a photoelectric conversion device according to claim 1 wherein the semiconductor nanoparticles dispersed in the paste retain a sensitizing dye.

7. The method of manufacturing a photoelectric conversion device according to claim 1 wherein the photoelectric conversion device is a wet solar cell.

8. The method of manufacturing a photoelectric conversion device according to claim 1 wherein the binder is selected from the group consisting of cellulose, kinds of polyether, polyvinyl alcohol, polyacrylic acid, polyachrylamide, polyethylene glycol, polyethylene imine, poly(metha)acrylic methyl, polyvinylidene fluoride, styrene butadiene rubber, polyamide imide, polytetra fluoroethylene (fluorocarbon resin), or combinations thereof.

9. A photoelectric conversion device using a semiconductor electrode comprising semiconductor nanoparticles, the device comprising:
    said semiconductor electrode formed by:
    coating a paste containing a binder and semiconductor nanoparticles dispersed therein on a transparent conductive substrate; and
    forming the semiconductor electrode by drying the paste, and thereafter pressing the paste to bond the semiconductor nanoparticles onto the transparent conductive substrate while heating it to a temperature in the range from 30° C. to a softening temperature of the transparent conductive substrate, wherein pressing the paste includes contacting the paste with a device suited for pressing.

10. The photoelectric conversion device according to claim 9 wherein the photoelectric conversion device is a wet solar cell.

11. A method of manufacturing a photoelectric conversion device using a semiconductor electrode comprising semiconductor nanoparticles, the method comprising:
    coating a paste containing a binder and containing semiconductor nanoparticles retaining a sensitizing dye and dispersed therein on a transparent conductive substrate; and
    forming the semiconductor electrode by drying the paste, and thereafter pressing the paste to bond the semiconductor nanoparticles onto the transparent conductive substrate while heating it to a temperature in the range from 30° C. to a lower one of a softening temperature of the transparent conductive substrate and a deactivation temperature of the sensitizing dye, wherein pressing the paste includes contacting the paste with a device suited for pressing.

12. The manufacturing method of a photoelectric conversion device according to claim 11 wherein the photoelectric conversion device is a wet solar cell.

13. A photoelectric conversion device using a semiconductor electrode comprising semiconductor nanoparticles, the device comprising:
    said semiconductor electrode formed by:
    coating a paste containing a binder and containing semiconductor nanoparticles retaining a sensitizing dye and dispersed therein on a transparent conductive substrate; and
    forming the semiconductor electrode by drying the paste, and thereafter pressing the paste to bond the semiconductor nanoparticles onto the transparent conductive substrate while heating it to a temperature in the range from 30° C. to a lower one of a softening temperature of the transparent conductive substrate and a deactivation temperature of the sensitizing dye, wherein pressing the paste includes contacting the paste with a device suited for pressing.

14. The photoelectric conversion device according to claim 13 wherein the photoelectric conversion device is a wet solar cell.

15. A method of manufacturing an electronic apparatus using a semiconductor electrode comprising semiconductor nanoparticles, the method comprising:
    coating a paste containing a binder and semiconductor nanoparticles dispersed therein on a substrate; and
    forming the semiconductor electrode by drying the paste, and thereafter pressing the paste to bond the semiconductor nanoparticles onto the substrate while heating it to a temperature in the range from 30° C. to a softening temperature of the substrate, wherein pressing the paste includes contacting the paste with a device suited for pressing.

16. An electronic apparatus using a semiconductor electrode comprising semiconductor nanoparticles, the apparatus comprising:
    said semiconductor electrode formed by:
    coating a paste containing a binder and semiconductor nanoparticles dispersed therein on a substrate; and
    forming the semiconductor electrode by drying the paste, and thereafter pressing the paste to bond the semiconductor nanoparticles onto the substrate while heating it to a temperature in the range from 30° C. to a softening temperature of the substrate, wherein pressing the paste includes contacting the paste with a device suited for pressing.

17. A method of manufacturing an electronic apparatus using a semiconductor electrode comprising semiconductor nanoparticles, the method comprising:
    coating a paste containing a binder and containing semiconductor nanoparticles retaining a sensitizing dye and dispersed therein on a substrate; and
    forming the semiconductor electrode by drying the paste, and thereafter pressing the paste to bond the semiconductor nanoparticles onto the substrate while heating it to a temperature in the range from 30° C. to a lower one of a softening temperature of the substrate and a deactivation temperature of the sensitizing dye, wherein pressing the paste includes contacting the paste with a device suited for pressing.

18. An electronic apparatus using a semiconductor electrode comprising semiconductor nanoparticles, the apparatus comprising:
said semiconductor electrode formed by:
coating a paste containing a binder and containing semiconductor nanoparticles retaining a sensitizing dye and dispersed therein on a substrate; and
forming the semiconductor electrode by drying the paste, and thereafter pressing the paste to bond the semiconductor nanoparticles onto the substrate while heating it to a temperature in the range from 30° C. to a lower one of a softening temperature of the transparent conductive substrate and a deactivation temperature of the sensitizing dye, wherein pressing the paste includes contacting the paste with a device suited for pressing.

* * * * *